United States Patent [19]

Stocker et al.

[11] 4,159,443
[45] Jun. 26, 1979

[54] ELECTROLUMINESCENT OPTICAL DEVICES

[75] Inventors: Hans J. Stocker, Summit; LeGrand G. Van Uitert, Morris Township, Morris County, both of N.J.

[73] Assignee: Bell Telephone Laboratories, Incorporated, Murray Hill, N.J.

[21] Appl. No.: 925,786

[22] Filed: Jul. 18, 1978

[51] Int. Cl.$^2$ .................... H05B 37/00; H05B 39/00; H05B 41/00
[52] U.S. Cl. ................................. 315/169.3; 365/110
[58] Field of Search .................. 315/169 R, 169 TV; 340/324 M; 365/110, 231, 239

[56] References Cited
PUBLICATIONS

Abstract D-8 of program issued to attendees of the 20th Annual Electronic Materials Conference, Jun. 28, 1978.
"IBM Scientists Report Observation of Light Bubbles," Electronics, Jul. 6, 1978, p. 33.
Topics in Applied Physics, vol. 17, Electroluminescence, "Phosphor Films," Chapter 6, pp. 197–210, 1977.

Primary Examiner—Alfred E. Smith
Assistant Examiner—Robert E. Wise
Attorney, Agent, or Firm—George S. Indig

[57] ABSTRACT

Devices of the nature of magnetic bubble devices, but in which "bits" take the form of light spots, are described. A prototypical device takes the form of an electroluminescent, photoconducting film straddled by orthogonal arrays of insulated strip electrodes forming closely spaced intercept positions so arranged that during operation such intercepts are sequentially biased. A light spot once nucleated--e.g., through a combination of electroinduced and photoinduced luminescence, is stepped by applying bias below nucleation threshold. Devices may serve a variety of memory and/or logic functions.

16 Claims, 2 Drawing Figures

ELECTROLUMINESCENT OPTICAL DEVICES

BACKGROUND OF THE INVENTION

A. Technical Field

The magnetic bubble device described in Bell System Technical Journal, 46, 1901 (1967) exemplifies a family of stepping memories in which bits are caused to traverse discrete positions by moving bias of a level inadequate to nucleate but sufficient to propagate. Devices of this nature are expected to play an increasing role and to serve functions of apparatus in which bit movement is brought about mechanically (magnetic tape, disc).

In addition to serving as memories, such devices may be caused to perform logic functions in which bits may attract, repel, multiply, etc.

Another category of devices sometimes serving as displays depend upon luminescence which may be induced electrically. Again, such luminescent devices may serve memory functions. Since "bits" may be visible, they may also serve display functions—e.g., alpha numeric or pictorial.

A combination of function is visualized—i.e., memory or logic devices with self-contained, visible read out.

B. History

A form of electroluminescence depends upon flowing electrons traveling within an insulated electroluminescent medium under the influence of an applied ac bias. The bias creates an electric field which accelerates electrons, with luminescence resulting from collisions with luminescence centers. Photons emitted from such center may be in the visible band. In a particular material, manganese-doped zinc-sulfide, light emitted is yellowish—of a center wavelength of approximately 5,800 Angstrom units.

In *Topics in Applied Physics*, Vol. 17, Springer-Verlag, p. 197, it is shown that light emission may be produced in such material responsive to applied electrical pulses above a well-defined threshold value and that a hysteresis in emission versus field can be observed.

Further, in *Applied Physics Letters* 31, 452 (1977) it is shown that emission from ZnS:Mn occurs in filaments that are less than 1 $\mu$m in diameter, having negative resistance characteristics and which are either off or on in a state of saturated emission. In addition, experimental evidence for current filaments in Ge is reported in *Journal of Applied Physics* 33, 995 (1962) and it has been shown in Proceedings in the Physical Society, 82, 954 (1963) that such filaments will form in any material with a negative resistance characteristic. It is a simple step from this observation to state that visible emission will result from a current filament if the material is also electroluminescent, e.g., ZnS:Ag, GaAs, GaP etc. Recently, in Electronics, July 6, 1978, p. 33. it was reported that experimental work on the ZnS:Mn system revealed properties of device interest—i.e., useful mobility, stable bias levels, useful lifetimes, etc. It was also suggested that while the phenomenon was of interest for devices functioning in the manner of bubble memories, techniques for reliably stepping bubbles from position to position had not been found.

SUMMARY OF THE INVENTION

Memory, as well as logic, devices in which bits take the form of light spots are reliably stepped through a sequence of defined positions by means of a correspondingly moving electrical bias imposed across the electroluminescent material with such bias at a level somewhat below that required for spot nucleation. Invention is largely premised on the manner in which spots are propagated with the mechanism taking the form of a combination of the electrical bias used for stepping together with an additional means for "lowering threshold". The responsible mechanism takes advantage of the observation that in a photoconductive, photoluminescent material, the light spot, itself, defines a region of increased conductivity. The effect of this increased conductivity is to increase the number of excitation collisions and thereby lower threshold so that biasing levels below the luminescence threshold may serve to propagate already nucleated light spots without at the same time introducing new "error bits". Spot nucleation may take any of several forms: e.g., use of an electrical pulse above threshold; use of an ancillary pulse added to the propagating pulse to produce a cumulative bias sufficient to nucleate; or use of light, itself, for example, by means of a laser either independently or, again, in conjunction with a propagating bias. Device configuration may involve intercepting electrode sets. Straddling electrodes may form parallel arrays on one side of the film orthogonal to those on the other. In general, devices are planar and may consist of one or more levels, each defined by a layer of electroluminescent, photoconductive material which is, in turn, insulated from at least one of a pair of straddling electrode arrays. Nucleation of a light filament in an adjacent film may be induced by a coincidence of a bias field and end emission from a spot in the first film. Device operation for a given film may take the familiar form of a half current array. Multilayer devices take on a three-dimensional aspect permitting propagation of spots from layer to layer, as well.

A large variety of appropriate materials are known. A number of them depend upon zinc sulfide with dopants such as manganese, copper, and/or silver serving as luminescent collision centers. Other materials similarly contain semiconducting photoconducting matrices doped with centers which serve to contribute the desired luminescent properties—i.e., wavelength, lifetime, etc.

In general, devices of the invention are insulated from circuitry so that electron motion is necessarily responsive to ac electrical bias. In general, incidence of collision is increased with increasing ac frequency at least to frequencies up to about one megahertz for contemplated layer thicknesses. Since the described devices are essentially field rather than current devices, current drain is largely due to the imperfect nature of the series insulation.

DETAILED DESCRIPTION

A. General

Figure 1:
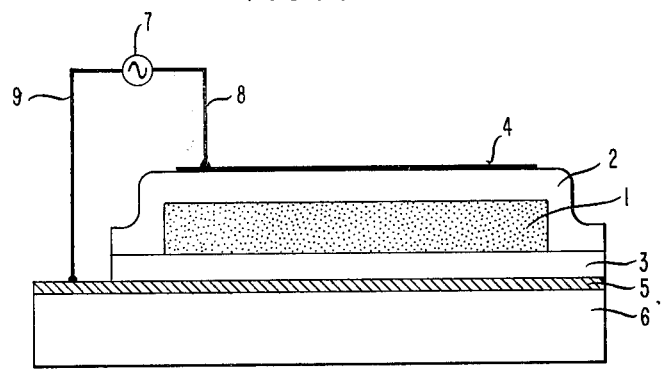

Devices of the invention are of the "destructive" memory category in the sense that bits decay and become irretrievable upon removal of biasing field. In other respects, they may serve the various functions of other devices which depend upon propagation of already nucleated information bits. A prime example is the magnetic bubble device which, like those of the invention, is planar; which may be made up of more than one planar level; which may function as a simple serial memory; which may serve a variety of logic functions.

In addition, since by their very nature devices of the invention are luminescent, those operating within the visible spectrum offer the possibility of serving as displays, as well. Displays may take on the form of visible read out in devices otherwise performing usual memory or logic functions; or may serve as alpha numeric or pictorial displays with information derived from other sources.

Aspects of the invention which are the subject of portions of this section include those relating to device design and composition.

B. Device Design

Device function is dependent upon the photoconductive effect which permits reduced threshold propagation of already nucleated spots in the immediate vicinity of the spot. This consideration—the essential thrust of the invention—gives rise to the requirements that stepping positions, however defined, be sufficiently closely spaced to permit propagation. Fortunately, the very nature of the mechanism gives rise to economically small bits which augur well for successful competition with other types of memories. Photoconductivity, at a peak at the center of the light spot, drops off, probably in Gaussian manner to and beyond the edge of the perceptible spot. Bias may be adjusted to accommodate a variety of spacings with required biasing increasing as position spacing increases. While in principle resistance is lowered at any distance from a spot throughout the layer, lower error discrimination requires substantial change with corresponding decrease in threshold. It is possible in principle to adjust bias to accommodate any position spacing while permitting propagation of existing spots without nucleating (the latter resulting in error bits). In general, however, on the premise that a threshold lowered by amount of at least 5 percent is required, particularly in a coincident current device. Spacings no greater than 1-10 microns are indicated under usual operating conditions.

An additional parameter available to the device designer concerns the range of photoconductive influence of the spot. This range, regardless of desired threshold lowering, is composition-dependent.

The photoconductance of a material depends upon several factors: the optical absorption cross section, the lifetime of the charge carriers created by the absorption and their mobility. The optical absorption crossection depends upon the type and concentration of the complex involved in the optical transition. The lifetime of the optically generated charge carriers can be controlled over many orders of magnitude by the deliberate introduction of impurities and imperfections. Mobility also can be controlled by the deliberate introduction of scattering centers; the upper limit is determined by pure phonon scattering. The relative importance of activator readsorption of light and band edge adsorption is dependent upon the efficiency of re-emission from the activator and the strength of the band absorption at the optical wavelength of concern. The most efficient transfer is for complete direct absorption by the host structure. However, resonant transfer from between several strongly absorbing activator centers can also be useful as there is a probability for exciting the lattice instead of resonant transfer at each step.

Another design parameter is layer thickness. Increasing thickness has the expected effect of increasing required bias to produce the necessary acceleration for photon emission. It also, however, may result in spot broadening as well as spot multiplication due, inter alia, to repulsion of electrons, themselves.

Appropriate choice of electrode dimension, electrode spacing layer thickness, composition, and operating conditions may result in devices with contact spacings ranging from many microns to smaller sizes dependent upon lithographic capability. An attribute of the inventive devices has to do with high mobility of electrons, as well as photons, with the result that access time is limited by ancillary circuitry and equipment rather than bit velocity.

Thickness dimensions are optimized depending upon a number of considerations. For example, maximum brightness may be desired where read out is optical or where display is a significant function. Upon other circumstances, the brightness of the spot at least at intermediate positions may not be significant—the required photoconductivity at some spacing may be the critical consideration. In general, where brightness is not, per se, significant, thicknesses of the functional layer, as well as any insulation layers are small—as small as is consistent with the need for a high yield of continuous material. Exceeding such minimum dimensions necessarily results in an increase in power requirement, as well as some increase in spreading (initially of electrons—eventually of the range of influence of photon emission). Layer thicknesses of the order of a micron or less are regularly attained and are generally desired for maximum bit density commensurate with minimum power.

Thicknesses of the order of many microns and greater do not preclude device function and may be desirable particularly where bit density is not the prime consideration.

Alternative design may make use of a continuous two-dimension film electrode perhaps of transparent material. Coincident current operation may depend upon two sets of crossed arrays, insulated from each other but both on the same device face, etc.

C. Composition

Compositions usefully employed in devices of the invention must have both appropriate electronic conductivity and photo characteristics. Materials of the invention must be both electroluminescent and photoconductive—it is this combination of the characteristics that gives rise to the novel propagation mechanism upon which all of these devices depend. In general, coexistence of these properties to the extent required gives rise to a matrix material which is a traditional semiconductor and which is doped with a luminescent center to result in defined wavelength of emission. However, certain materials may themselves, be possessed of both characteristics. Zinc sulfide, itself, for example, is both photoconductive and electroluminescent although it is likely that electroluminescence is, in fact, due to some extrinsic influence—e.g., impurity or crystal defect.

A number of well-understood materials are satisfactorily incorporated in these devices. Zinc sulfide containing manganese, copper and/or silver as dopant is exemplary. Inclusion of dopant at a level of at least $10^{-2}$ atom percent by weight assures sufficient luminescent centers to permit adequate light emission for operation under acceptable conditions. Lesser concentrations are permitted for higher bias or under other circumstances explicit or implicit in the description of Section B. above. Other semiconductors which may serve are CdS, ZnSe, and Ga(As,P) with suitable dopants including Mn, Cu, and Ag. It is known that defects may serve as lumincescent centers in these systems as well. Minimum doping levels generally are about $10^{-3}$ atom percent for Cu and Ag and about 0.1 atom percent for Mn.

It is no requirement that layer materials be single crystalline. The effect of crystal boundaries is to produce scattering as well as some perturbation in orderly electron flow which, while consequential, does not generally preclude operation. In general, layer thicknesses of the order contemplated are sufficiently small that electron flow paths are generally single crystalline or include only a very small number of crystalline boundaries.

While it is conceivable that devices may function as current rather than field devices thereby permitting dc bias, current drain may be excessive. Accordingly, devices of the invention are generally described in terms of insulated electrodes. While but a single insulation layer may suffice, designs generally discussed depend upon electrical isolation at both electrode positions. Insulation requirements are conventional. Insulation layers should be thin so that most of the applied electrical field is operative; electronic conductivity should be low, since this is the likely mechanism primarily responsible for current drain. Probably most significant from the practical standpoint is the need for continuity in insulation layers which are chemically and physically compatible both with functioning electroluminescent-photoconductive material and with the electrodes, themselves. Barium titanate, $BaTiO_3$, with a bulk resistivity of the order of $10^{12}$ ohm cm, may be laid down by sputtering or vacuum evaporation to result in a thickness as little as 100 $\mu$m. Other materals which may be deposited by similar means include MgO, $Y_2O_3$, $Al_2O_3$, $TiO_2$, $SrTiO_3$, and $SiO_2$.

Electrode materials may be metallic, with stripes or other patterns being formed by any of the procedures common to integrated circuit fabrication. Under certain circumstances, where maximum visibility may be required for display or optical read out, use may be made of transparent electrode materials, notably doped tin oxide or combinations of tin oxide with indium oxide.

D. Ancillary Apparatus

Device operation as ordinarily contemplated implies both means to introduce information and means to extract information. The latter may or may not include the circuitry required for propagation of the nucleated spots. In many of their uses, devices of the invention are completely analogous to other memory or logic devices such as bubble devices. Information introduction and extraction may, in principle, be identical with differences introduced only by reason of the nature of the "bits".

Input, necessarily digital, is generally prosaic. Design depends upon specific assigned function. It may involve an A-to-D converter; it may involve a pulse series which is in the as-generated form. Various types of apparatus may be used for initial spot generation. One form of input involves an LED or a laser for initial nucleation. Another may take the form of an electric field, large relative to the propagating field. It may include a site of lowered threshold due to a variation in composition such as increased concentration of luminescent centers. Information extraction may, again, be analogous to other known devices and, accordingly, light spots may be read by a photoelectric detector to produce the electrical pulse stream of the form generally desired. Information extraction may involve light, per se, as in visible display or in the form of optical circuitry. Accordingly, a stream of light pulses may represent extracted information. These may be introduced into integrated optic circuitry, may be transmitted over fiber communication lines, etc.

E. The Figures

D. BRIEF DESCRIPTION OF THE DRAWING

Figure 2:
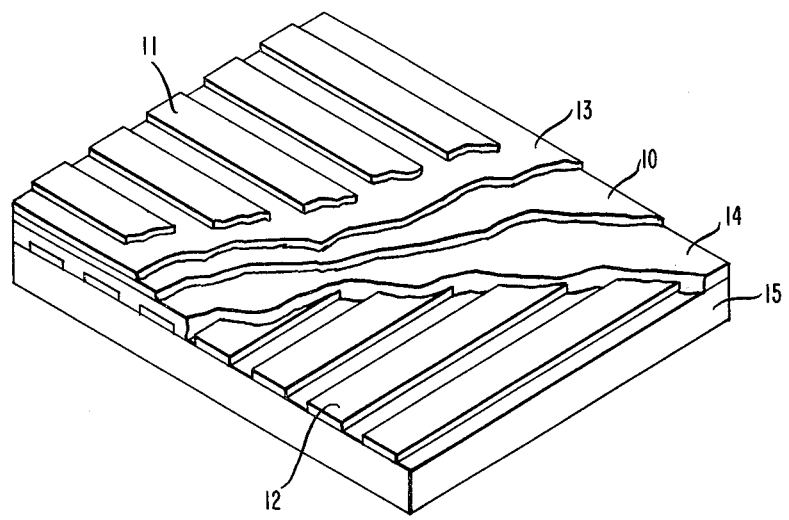

Two figures are presented:

FIG. 1 is an end view schematically depicting a single layer device of the invention; and FIG. 2 is an isometric view of a device such as that depicted in FIG. 1 but cutaway to illustrate an electrode arrangement suitable for coincident current operation.

2. DETAILED DESCRIPTION OF THE FIGURES

FIG. 1 depicts a functional layer 1 which may, for example, be a 5,000 Angstrom unit thick layer of ZnS:Mn straddled by—in this instance, encompassed by—insulating layer pair 2 and 3, each of which may be regarded as 2,000 Angstrom units thick and composed of $BaTiO_3$. Electrical access is through metal electrode 4 which may be made of aluminum and electrode 5 which, in this particular embodiment, is a transparent layer of doped $SnO_2$. Supporting substrate 6 is, in this instance, also transparent and made of glass. Schematically, signal is introduced by means 7 which is designed to introduce digital information via leads 8 and 9.

In FIG. 2, a functional layer 10 is straddled by first electrode array 11 and second electrode array 12, each being composed of parallel conducting strips with arrays orthogonal one to the other so as to define intercept positions permitting half current operation. Electrode arrays 11 and 12 are insulated from functional layer 10 by insulating layers 13 and 14. Again, the device is depicted as supported in this instance by substrate 15. Means not shown perform the function of nucleating spots, propagating spots, and accessing.

The electrode array of FIG. 2 represents a promising but not exclusive arrangement. Other arrangements may utilize noncoincident currents with whole currents rather than half currents being used to propagate spots. While continuous electrodes of the type shown in FIG. 2 are certainly familiar, discontinuous electrodes may be usefully employed with propagation perhaps still owing to electrical bias. Propagation may be by e-beam or light beam scanning, the latter utilizing low work function electrode materials; the former requiring no electrodes at all.

We claim:

1. Device comprising a first medium adapted for nucleation and propagation of bits, said bits being evidenced as a change of state of the said medium and representing information, together with means for propagating said bits through the said medium, CHARACTERIZED IN THAT the said bits are light spots produced by luminescence, the said medium is both electroluminescent and photoconductive, in that the said means includes electrical means for biasing the said medium at a level below that required to nucleate the said bits but sufficient to propagate existing bits, the bias required to propagate being lower than that required to nucleate due to lattice absorption of photons from existing light spots in the vicinity of such spots, whereby the cumulative influence of electrons due to the said electrical means and electrons due to the photoconductive effort are together sufficient to result in propagation.

2. Device of claim 1 in which the said biasing means includes conducting electrodes.

3. Device of claim 2 in which the said medium is a layer in which the said electrodes staddle the said layer and in which electrodes are electrically insulated from the said medium on at least one face of the said layer.

4. Device of claim 3 in which the said electrodes comprise two arrays of essentially parallel conducting strips, the first array being on one broad face of the said layer and the second array being on the other broad face of the said layer, the two arrays being nonparallel so as to form intercepts.

5. Device of claim 4 in which the said electrical means produces a bias which is due to the cumulative influence of bias applied to a member of each said array with the bias attaining a sufficient level to result in propagation of a bit only at the position of an intercept.

6. Device of claims 1, 2, 3, 4, or 5 in which the said biasing means scans the said layer so as to produce a regular progression of bits from a starting position.

7. Device of claim 1 provided with generating means for nucleating bits.

8. Device of claim 1 in which the said medium comprises a semiconductive material.

9. Device of claim 1 or 8 in which the said medium comprises a semiconductive material which has extrinsic luminescent properties.

10. Device of claim 9 in which extrinsic luminescent properties are primarily due to dopant.

11. Device of claim 10 in which the semiconductive material comprises at least one composition selected from the group consisting of ZnS, CdS, ZnSe, and Ga(As,P).

12. Device of claim 1 in which the said medium comprises ZnS doped with Mn.

13. Device of claim 1 in which light spots appear as films of light extending substantially throughout the thickness of the said medium.

14. Device of claim 13 in which electrode spacing is of the order of microns.

15. Device of claim 14 in which electron flow responsive to the said electrical means is over a path at least sometimes coincident with any light spot at an adjacent electrode position.

16. Device of claim 15 in which luminescence is within the visible spectrum.

* * * * *